United States Patent [19]

Jewett et al.

[11] Patent Number: 4,599,132
[45] Date of Patent: Jul. 8, 1986

[54] GUIDANCE SYSTEM FOR LOW ANGLE SILICON RIBBON GROWTH

[75] Inventors: David N. Jewett, Harvard; Herbert E. Bates, Ashby, both of Mass.; Joseph B. Milstein, Denver, Colo.

[73] Assignee: Energy Materials Corporation, So. Lancaster, Mass.

[21] Appl. No.: 692,844

[22] Filed: Jan. 18, 1985

[51] Int. Cl.$^4$ .............................................. C30B 15/06
[52] U.S. Cl. ............................................... 156/617 H
[58] Field of Search ................... 156/617 H, DIG. 97, 156/DIG. 88, DIG. 64; 422/249

[56] References Cited

U.S. PATENT DOCUMENTS

| | | | |
|---|---|---|---|
| 4,264,407 | 4/1981 | Shudo et al. | 156/DIG. 97 |
| 4,267,010 | 5/1981 | Bates et al. | 156/608 |
| 4,289,571 | 9/1981 | Jewett | 156/617 H |
| 4,322,263 | 3/1982 | Kudo et al. | 156/617 H |
| 4,329,195 | 5/1982 | Kudo | 156/DIG. 97 |

*Primary Examiner*—Hiram H. Bernstein
*Attorney, Agent, or Firm*—Kenway & Jenney

[57] ABSTRACT

In a low angle silicon sheet growth process, a puller mechanism advances a seed crystal and solidified ribbon from a cooled growth zone in a melt at a low angle with respect to the horizontal. The ribbon is supported on a ramp adjacent the puller mechanism. Variations in the vertical position of the ribbon with respect to the ramp are isolated from the growth end of the ribbon by (1) growing the ribbon so that it is extremely thin, preferably less than 0.7 mm, (2) maintaining a large growth zone, preferably one whose length is at least 5.0 cm, and (3) spacing the ramp from the growth zone by at least 15 cm.

2 Claims, 4 Drawing Figures

GUIDANCE SYSTEM FOR LOW ANGLE SILICON RIBBON GROWTH

BACKGROUND OF THE INVENTION

This invention relates in general to the growth of crystalline ribbons. More specifically, it relates to an improved guidance system for silicon ribbons being grown generally horizontally using a "low angle" process.

The most common approach to the growth of crystalline ribbons, particularly single crystal ribbons of silicon or related semiconductor materials, has been vertical growth from a melt using dies to shape the crystal. U.S. Pat. Nos. 4,248,645 and 4,267,100 are representative of this approach and the '100 patent describes a parallel plate guidance system compatible with this vertical growth technique.

A more recent approach is to grow the ribbon from a melt at a small angle above the horizontal. This "low angle silicon sheet" (LASS) technique is described in detail in U.S. Pat. No. 4,289,571 to one of the present applicants, which is incorporated herein by reference. In general, the LASS technique uses a shallow crucible that holds a melt of liquid silicon. A "scraper" is mounted in the crucible at one end of a growth zone. The melt temperature in the growth zone is carefully adjusted to a value that produces crystalline growth at a very thin leading edge of a seed crystal and then the growing crystal ribbon. A puller mechanism draws the seed crystal and the continuous, single crystal ribbon from the melt at the aforementioned small positive angle. Because of this angle, a meniscus of liquid silicon forms under the solid ribbon and above the surface of the melt. The scraper, which projects slightly above the melt surface, blocks the lower end of the meniscus. The upper end of the meniscus continually detaches from the underside of the ribbon during the pulling.

Several important aspects of this growth technique are that (1) the growth dynamics at the leading edge are sensitive to temperature variations and (2) it is extremely difficult to produce and maintain a stable temperature profile that produces solidification at the leading edge while also avoiding the growth of dendrites or the growth of a ribbon with dislocations or a high degree of non-uniformity in its cross-sectional dimensions.

With the LASS technique it is also necessary to support and guide the as grown ribbon, which is at a high temperature and still somewhat plastic, in the region between the scraper and the puller. Heretofore the principal solution to this problem was the straightforward expedient of placing a rigid, inclined guide plate or "ramp" under the ribbon adjacent to the scraper and co-planar with the nip of the rollers or belts of the puller. This arrangement, however, exhibits a serious problem. The ribbon can contain irregularities on its bottom surface, typically small (6 mm wide by 3 mm high or smaller) "platelets" of SiC. When these irregularities reach the ramp, because the ramp is fixed, the entire ribbon is raised by the height of the irregularlity. This in turn raises the end of the ribbon in the melt defined by the growth zone. This upward movement at the melt disturbs the orderly formation of the crystal at the leading edge. Orderly crystal growth is a very delicate phenomenon, critically dependent on proper maintenance of temperature gradients in and adjacent to the growth zone. Therefore, elevation of the leading edge by even one millimeter can disrupt the desired orderly growth. Such a disruption takes many forms including dendritic growth and thickening of the forming crystal ribbon. The upward movement at the leading edge creates a meniscus between the leading edge and the liquid melt. Crystal growth proceeds down the meniscus to create a wave in the bottom surface of the ribbon. When this disruption wave reaches the ramp, it also elevates the entire ribbon to repeat the process, but usually with an increased amplitude in the second wave. This problem not only produces a ribbon with varying dimensions, but more significantly it eventually disrupts the entire growth process.

Previous attempts to control this wave problem have, in general, focused on controlling the vertical movement of the ribbon close to the scraper. One solution was to support the ribbon on a ramp as before, but also to top load the ribbon with a set of rollers. This system had no material affect on the "wave" problem. Another approach was to place the ramp above the ribbon with its bottom supported by a set of rollers mounted in a frame with multiple independent pivot axes arrayed along the pulling direction. This arrangement readily accommodates variations in the bottom surface, but underside support structure was so flexible that it would twist, it would not support the ribbon well, and most significantly, the growth end of the ribbon would continue to move to an unacceptable degree in response to the bottom surface irregularities. Another solution was to create a variable gap near the crucible using upper and lower plates that sandwiched the ribbon. Pivoted link arms connected the plates and there was an arrangement for gradually moving the upper plate downwardly to narrow the gap and thereby control the vertical excursions of the ribbon. This approach also showed little or no improvement over the plain ramp. Some improvement was achieved using a long bottom ramp between the scraper and the puller, but with a graphite felt covering on its upper surface. This arrangement, however, is not ideal because the growth end of the ribbon is not fully stabilized and because the hot ribbon deteriorates the felt. Therefore, while some improvement is observed for short lengths of ribbon (e.g. 10 to 20 m), this guidance and support system is not satisfactory for continuous commercial production of ribbon in lengths of hundreds of meters. In summary, no known guidance system for the LASS growth technique has controlled the wave problem to a degree that is acceptable for use in commercial production.

It is therefore a principal object of this invention to provide a support and guidance system for crystalline ribbon, particularly single crystal silicon ribbons grown by the LASS technique, which substantially eliminates vertical movements of the ribbon in the growth zone due to irregularities on the bottom surface of the as grown ribbon.

Another object is to provide a system with the foregoing advantage that is uncomplicated, cost effective and fully compatible with known LASS equipment.

A further object is to provide a system with the foregoing advantages that is sufficiently reliable and durable for use in continuous commercial production of silicon ribbon.

SUMMARY OF THE INVENTION

The ribbon support and guidance system of the present invention utilizes the resiliency of the ribbon itself to isolate vertical movements at a fixed guide surface, preferably an inclined graphite ramp located under the ribbon, from the end of the ribbon crystallizing in a growth zone of a shallow crucible. The ribbon is grown with a "low angle silicon sheet" (LASS) technique where the ribbon is pulled from the crucible at a small positive angle from the horizontal over a scraper mounted in the crucible. A conventional puller mechanism such as pairs of rollers operating under microprocessor control draws the ribbon. Growth begins at a leading edge of the ribbon in the growth zone. The growth zone extends in the pulling direction from the leading edge to the scraper which pins the lower edge of a liquid silicon meniscus that forms under the ribbon because of its inclination from the horizontal. The meniscus detaches from the bottom of the solid ribbon as it passes the scraper.

To control vertical excursions of the ribbon in the growth zone due to irregularities striking the ramp, the present invention utilizes three steps. First, the pulling rate or other parameters affecting the growth is controlled to produce a ribbon that is thin, typically less than 0.7 mm for silicon, as compared to a conventional ribbon's thickness grown by this technique. Second, the guide ramp is spaced from the scraper a sufficient distance to allow the thin ribbon to dissipate flexures over the unsupported ribbon length. Preferably in the growth of silicon ribbon the scraper-to-ramp spacing is at least 15 cm. Finally, the area of the growth zone is comparatively large to provide a large "wet loading" that resists an upward movement of the ribbon at the growth zone. Preferably in the growth of silicon ribbons by the LASS technique, the length of the growth zone (measured in the pulling direction from the leading edge to the scraper) is at least 5.0 cm and preferably greater than 6.0 cm.

DETAILED DESCRIPTION OF THE PREFERRED EMBODIMENTS

Figure 1:
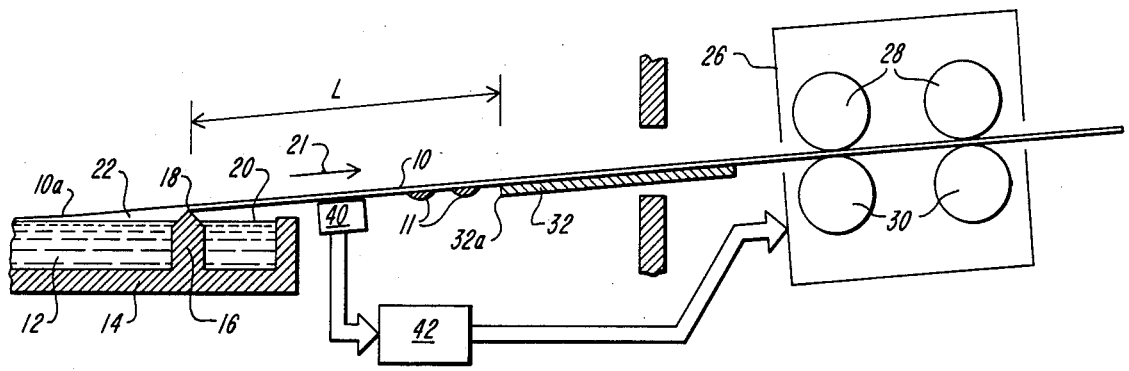
FIG. 1 is a sectional view in side elevation of a crystal ribbon growing apparatus made according to the invention.
Figure 2:
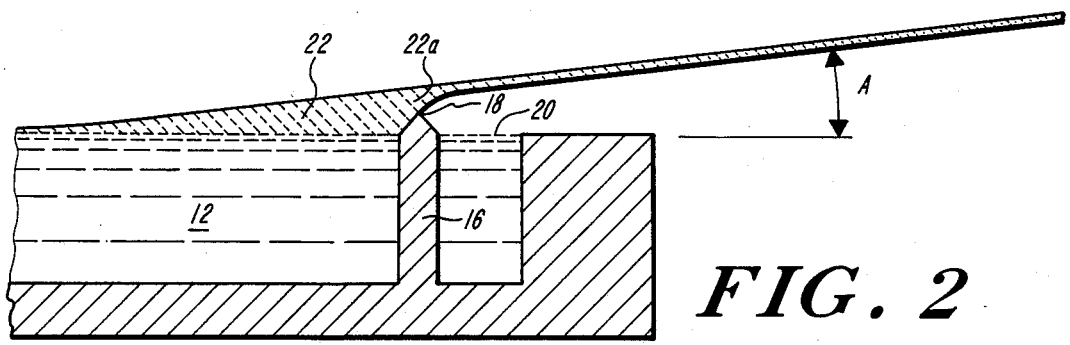
FIG. 2 is a detail view of FIG. 1 on an enlarged scale.
Figure 4:
FIG. 4 is a cross-sectional view taken along the line 4—4 of FIG. 3.

FIG. 1 shows an apparatus for carrying out a method for continuously growing a single crystal ribbon 10 of silicon of semiconductor quality from a silicon melt 12 using a "low angle silicon sheet" (LASS) technique described in detail in U.S. Pat. No. 4,289,571 to one of the present applicants and commonly assigned with the present application, the disclosure of which is incorporated herein by reference. The surface of the ribbon 10, particularly its lower surface, may contain projecting irregularities 11 such as "platelets" of SiC discussed above or other impurities, shown with exaggerated dimensions in FIGS. 1 and 4. As described in the '571 patent, a shallow silica crucible 14 contains a quantity of silicon melt 12. The temperature profile within the melt is controlled by electrical resistance heating elements located principally, or exclusively, under the crucible and various thermal impedance elements disposed in the melt to adjust the spatial distribution of the heat of the heaters to provide a highly controlled temperature profile in which the silicon is liquid, but will solidify on a seed crystal to form the ribbon 10. Mounted within the crucible is an upright rigid scraper 16 where upper edge 18 extends slightly above (typically 0.5 mm) the surface 20 of the melt. The ribbon 10 is drawn in a direction indicated by an arrow 21 over the upper edge 18 at a small positive angle A from the melt surface 20, as is best seen in FIG. 2. This produces a raised meniscus 22 that is pinned "behind" the scraper and between the ribbon and the melt. It should be noted that the top 22a of the meniscus also extends for a short distance "ahead" of the scraper and continuously detaches from the underside of the ribbon as it advances.

Figure 3:
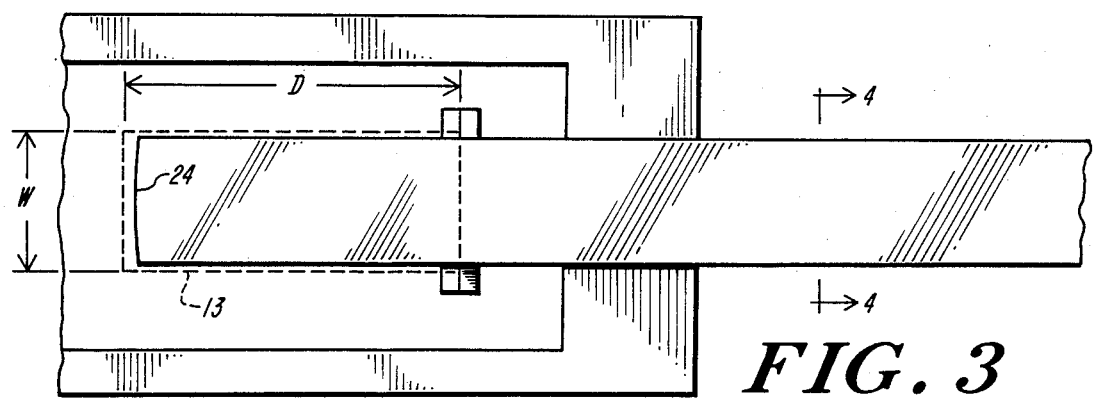
FIG. 3 is a top plan view of the detail shown in FIG. 2.

Crystal growth occurs at a slightly curved "leading edge" 24 near the rear portion of a growth zone 13 as is best seen in FIG. 3. The growth conditions at this leading edge are extremely sensitive to the temperature in the melt. Any significant movement of the solidified crystal, particularly movement in a vertical direction, can change the temperature of the melt at the leading edge 24 significantly to produce imperfections in the crystal being grown, or terminate growth.

A puller mechanism 26 of conventional design, such as a set of opposed rollers 28 and 30, grip the silicon ribbon 10 and rotate to advance the ribbon from the melt. The rollers preferably operate under microprocessor control in a manner well known to those skilled in the art to control the dimensions of the crystal being grown. For example, a transducer 40 can sense the thickness of the crystal and the output of this transducer can be an input to a microprocessor 42 that controls the speed of rotation of the puller mechanism 26. A graphite ramp 32 has an upper surface that is co-planar with the plane defined by the nips of the rollers. The ramp is positioned to support the ribbon 10 before it enters the puller mechanism.

The ribbon 10 can be viewed as a lever arrangement with the rollers providing an essentially infinite load at one end and the wet loading in the growth zone providing a load on the other end. As an irregularity rides onto the leading edge of the ramp 32, it exerts a lifting force on a central portion of the ribbon. Since one end is fixed, only the ribbon end 10a in the growth zone can react to this lifting force. The present invention involves a combination of features which have been found to be effective in controlling the lifting force on the ribbon end 10a.

An important feature of this invention is that the ramp 32 is a spaced distance L from the scraper tip 18, preferably, for silicon ribbons, by a distance of at least 15 cm. Another principal feature of the invention is that the puller mechanism draws the solidified ribbon at a rate such that the ribbon has a comparatively thin thickness X (FIG. 4), preferably less than 0.7 mm for silicon. The stiffness of the ribbon is proportional to the third power of its thickness. Decreasing the thickness of the ribbon therefore dramatically increases its flexibility. Ribbon thickness, as noted above, can be controlled as a function of the speed that the pulling mechanism 26 advances the growing ribbon from the melt. Thus, one can use these well known dimensional control techniques to control the pulling rate and therefore the ribbon thickness to produce a ribbon having an unusually small thickness value as compared to ribbons heretofore grown by the LASS technique. It should be noted that decreasing the width of the ribbon will also decrease its stiffness, but the decrease in stiffness varies directly with the width, not its third power. The thickness has therefore been found to be a much more significant parameter in determining the stiffness of the ribbon.

The combination of the reduced ribbon thickness and the separation L together introduce an unusual degree of resiliency in the silicon ribbon. This resiliency is sufficient to isolate from the portion 10a of the ribbon in the growth zone vertical movements of the ribbon as any projecting irregularities 11 on its bottom surface strike the leading edge 32a of the ramp 32 and then ride up onto the ramp. It should be noted that it is a combination of these two features that achieves this result. If, for example, the ramp was immediately adjacent to the crucible, then even a thin ribbon could transmit vertical displacements due to surface irregularities. If, on the other hand, the ribbon has a conventional thickness, e.g. in excess of 1.0 mm, then it would still transmit vertical displacements from the ramp to the growth zone despite a spacing L according to the present invention. With the present invention, rather than attempting to clamp the ribbon in a fixed vertical position, the inherent resiliency of the ribbon is used to dissipate a vertical displacement of the ribbon at the ramp through a flexure of the ribbon over the unsupported length L.

The invention also decreases the detrimental effect upon crystal formation of vertical excursions at the ramp by increasing the area of the growth zone 13. In the preferred embodiment, an increased area has been obtained by increasing the length D of the growth zone from a conventional length of perhaps 3 cm to a length that is preferably at least 5 cm, or preferably greater than 6 cm. (Of course, an increased width W will also produce an increased area, but other considerations usually dictate limitations on the maximum acceptable value for the width W.) Increasing the area of the growth zone is believed to produce two beneficial effects, both of which increase the "wet loading" on the end of the strip in the growth zone. First, increasing the area increases the area of contact between the growing ribbon and the molten material and consequently increases the volume of material that makes up the meniscus. The meniscus adheres to the lower surface of the growing ribbon. As a result, the downward gravitational force applied to the ribbon by virtue of the mass of the adhering meniscus further opposes the lifting effect of vertical excursions at the ramp upon the growing crystal. Increasing the length of the growth area also increases surface tension along this solid-liquid interface which further resists the tendency of the growth zone to follow vertical excursions produced by "irregularities" such as SiC platelets 11 that project from the lower surface of the ribbon 10 striking and riding up onto the ramp 32.

Establishing the desired length (or width) of the growth zone may be accomplished by several methods known to those skilled in the art such as varying the temperature of the crucible immediately adjacent to and below the growth zone and placing of variously shaped stabilizers near the leading edge of the growth zone as described in U.S. Pat. No. 4,289,571.

The invention also protects the growing ribbon against any disturbances tending to cause downward excursions in the growth zone. If the meniscus were to be urged downwardly, bouyancy and surface tension forces would tend to resist this downward urging. The bouyancy force upon the meniscus increases with the area of the meniscus and therefore with the length of the meniscus in the growth zone for a given width W.

The features of the present invention thus provide guidance for the silicon ribbon while at the same time isolating the displacements caused by projecting irregularities from the ribbon portion located in the growth zone. With this invention, typical irregularities produce substantially no movement of the ribbon end 10a located in the growth zone. Because the guidance system of the present invention deals effectively with projecting surface irregularities, silicon ribbons can be grown by the LASS technique in commercially viable lengths of hundreds of meters.

While the invention has been described with particular reference to the illustrated embodiments, modifications will occur to those skilled in the art. For example, while the invention has been described primarily with respect to the formation of crystalline silicon ribbons, it may be used to advantage in the ribbon formation of a variety of other crystalline materials that are prepared directly from the melt. Such materials may be conductive, non-conductive or semi-conductive and may have a variety of different applications. For example, sapphire windows may be formed with this procedure or bubble memory material, namely, gadolinium—gallium garnet, may be fabricated in ribbon form. Also, for example, other known types of puller mechanisms can be used.

Having thus described the invention, we claim:

1. In a method for growing a solidified crystalline ribbon from a growth zone on the surface of a melt held in a crucible where the solidified ribbon is drawn by a puller mechanism in a first direction at a low positive angle from the horizontal over a scraper projecting above the melt to an inclined support plate located between said crucible and said puller mechanism along said first direction and positioned to support said solidified ribbon on its upper surface, the improvement comprising the steps of controlling the growth rate of said ribbon so that the ribbon has a thickness of less than 0.7 mm, producing a growth zone with a length in said first direction of at least 5.0 cm to increase the wet loading of the melt at the end of the ribbon leaving the growth zone, and spacing said support plate from said scraper by at least 15 cm, whereby variations in the vertical position of the ribbon with respect to the ramp due to irregularities on the lower surface of said ribbon are dissipated through a flexure of said ribbon portion between said scraper and said support plate with substantially no corresponding vertical movements of the ribbon at the growth zone.

2. The improved ribbon growth method of claim 1 wherein said ribbon is formed of silicon.

* * * * *